United States Patent [19]
Glenat et al.

[11] Patent Number: 5,198,767
[45] Date of Patent: Mar. 30, 1993

[54] COMPACT NMR PROBE

[75] Inventors: Henri Glenat, Corenc; Nelly Kernevez, Grenoble, both of France

[73] Assignee: Commissariat a l'Energie Atomique, Paris, France

[21] Appl. No.: 679,449

[22] Filed: Apr. 2, 1991

[30] Foreign Application Priority Data

Apr. 4, 1990 [FR] France .................. 90 04323

[51] Int. Cl.$^5$ .................................... G01V 3/00
[52] U.S. Cl. ....................................... 324/301
[58] Field of Search ............... 324/301, 302, 307, 311, 324/315, 318, 322

[56] References Cited

U.S. PATENT DOCUMENTS

| | | | |
|---|---|---|---|
| 3,441,838 | 4/1969 | Salvi | 324/301 |
| 3,735,246 | 5/1973 | Glenat et al. | 324/301 |
| 3,886,440 | 5/1975 | Berry et al. | 324/301 |
| 4,891,592 | 1/1990 | Verdier | 324/301 |

FOREIGN PATENT DOCUMENTS 932801  8/1973  Canada .
206931 12/1986  France .

OTHER PUBLICATIONS

Revue de Physique Appliquee, vol. 5, No. 1, Feb. 1970, pp. 131-134, Paris, France, A. Salvi.
Revue de Physique Appliquee, vol. 5, No. 1, Feb. 1970, pp. 135-140, Paris, France, R. Miquel.

*Primary Examiner*—Louis Arana
*Attorney, Agent, or Firm*—Michael N. Meller

[57] ABSTRACT

A nuclear magnetic resonance probe incorporating at least two bottles with radical solutions, one having a positive nuclear polarization and the other a negative nuclear polarization, at least one high frequency coaxial resonator around each bottle respectively, an assembly of low frequency exciting-sampling coils. The coil assemblies are interconnected and connected to an amplifier in a loop oscillator connection. The probe comprises two blocks having a symmetry of revolution with respect to one axis and a symmetry with respect to a plane perpendicular to the axis of revolution. Each block incorporates at least one bottle having a shape of revolution about the axis and is symmetrical with respect to the plane of symmetry and a coaxial resonator having the same symmetries as the bottle. Each block contains the bottle, a double frequency coil of revolution about the axis and completely surrounds the resonator and the bottle. Each block is formed from two coils of revolution facing one another on either side of the plane of symmetry of the block. The two coils are interconnected.

10 Claims, 5 Drawing Sheets

COMPACT NMR PROBE

BACKGROUND OF THE INVENTION

The present invention relates to a compact nuclear magnetic resonance (NMR) probe. It is used in the precise measurement of magnetic fields and in particular the earth's magnetic field. The probe according to the invention is of a known type and is e.g. described in French patent applications FR-A-1 447 226 and FR-A-2 098 624.

The principle by which these probes operates will be briefly described. When a liquid sample, whose atomic nuclei have a magnetic moment and a kinetic moment of a non-zero nature, is exposed to a magnetic field the nuclear magnetic moments tend to be aligned parallel or antiparallel to the field. The energy difference between these two states defines a nuclear resonance energy or a nuclear resonance frequency, which is generally in the low frequency (lf) range of approximately 1000 Hertz.

However, with the standard fields and at ordinary temperatures, the overall nuclear polarization (positive or negative) of a sample remains low and difficult to detect.

The OVERHAUSER-ABRAGAM effect makes it possible to significantly increase this polarization. For this purpose a suitable paramagnetic substance is dissolved in a solvent, said substance being chosen so as to have a non-paired electron giving rise to an excited electron level with a hyperfine structure with four sublevels. Generally the pumping frequency is in the high frequency (hf) range of a few dozen megahertz.

The dipolar coupling between the electron spin of the thus excited paramagnetic substance and the nuclear spin of the solvent considerably increases the polarization of the latter. In accordance with the excited electron transition, the positive or negative nuclear polarization of the solvent is aided.

This procedure is further improved by using a double effect. A first radical solution (i.e. a solvent with a paramagnetic substance) is exposed to a high frequency, which saturates the electron level aiding the positive polarization of the solvent, whereas a second radical solution is exposed to a high frequency, which saturates the electron level aiding the negative polarization of the solvent.

In the first case, an excitation signal at the nuclear resonance frequency applied to the sample will be absorbed by the latter, whereas in the second case an excitation signal at said same frequency will lead to a stimulated emission at the resonance frequency. The sampling windings around the first and second solutions will then supply voltages of the same frequency, but of opposite phases. A connection in opposition will make it possible to form the sum thereof. All the interference signals induced in these windings and which have the same phase will be cancelled out.

Such a double effect probe can function with two different solutions and a single hf excitation frequency, provided that the absorption spectra of the two solutions are reciprocally displaced in such a way that the single frequency corresponds to the positive polarization in the one case and the negative polarization in the other.

However, a double effect probe can also function with the same solution subdivided into two samples and by applying to said two samples two different frequencies, in order to separately saturate the two sublevels of the paramagnetic substance.

Finally, by a final improvement, the signal supplied by the probe, which is at the nuclear resonance frequency, can be reinjected in the same way as the excitation signal of the samples into a loop connection, which then functions as an oscillator. In this way a probe of the spin coupling, double effect oscillator type is obtained. The probe according to the invention is of this type.

SUMMARY OF THE INVENTION

Thus, FIG. 1 shows a probe having a first positive polarization bottle 1 with its lf winding 2, a second negative polarization bottle 3 with its lf winding 4, a single hf resonator 5 surrounding the two bottles and a hf generator 6 supplying the said resonator. The two windings 2 and 4 are connected in series-opposition and are connected to the positive and negative inputs of a differential amplifier 7, whose output is relooped via a level regulator 8 to the lf windings, looping taking place across a resistive balancing bridge 9.

The signal frequency supplied by such an oscillator is equal to the nuclear resonance frequency, which is directly proportional to the ambient magnetic field, the proportionality factor being equal to the gyromagnetic ratio of the atomic nuclei.

FIG. 2 illustrates in greater detail the structure of such a probe and the form of the lf windings. This embodiment is described in FR-A-2 583 887.

As shown, the probe comprises two bottles 20, 22, each constituted by a hemisphere and a cylindrical contact ring. The two bottles are externally coated with a silvered metal coating 30, 32 and subdivided into non-contiguous sectors (to prevent circumferential eddy currents). The probe also comprises a central conductor formed from two half-sections 33a, 33b, the left-hand end 34 of the section 33a being connected to the central core of a coaxial cable 36 and the right-hand end 38 of the section 33b is connected to the conductive coating 32 of the bottle 22 by conductive strips 39.

The conductive coating 32 of the bottle 22 is connected to the conductive coating 30 of the bottle 20 by conductive strips 39', each conductive strip connecting sectors belonging to separate bottles.

The sampling and exciting windings of said probe comprise on the one hand two hemispherical windings 40, 42 outside the resonator and on the other hand two flat coils 44, 46 inside the resonator. The probe is completed by an external shield 48 formed from metal strips deposited on an insulating support.

The resonance frequency of the resonator is tuned by an amagnetic capacitor 50 located between the sections 33a and 33b of the central conductor. This capacitor is accessible from the outside by means of an opening 52 made in the shield 48.

The hemispherical windings 40, 42 are obtained by winding onto a spherical former and impregnating by a resin. The staircase shape of the external zones results from the fact that turns which would be located in these zones participate only slightly in the excitation and sampling and have consequently been eliminated, which reduces the weight of the probe.

The windings 40, 42 on the one hand and 44, 46 on the other are coiled and connected in such a way that the useful signals are summated and the interference signals cancelled out, as explained in the aforementioned prior art.

The particular shape given to the windings of FIG. 2 leads to a magnetic excitation field diagrammatically indicated by the lines H. As a result of this shape, no matter what the orientation of the probe relative to the field to be measured, there is still a sample volume for which the excitation field is not parallel to the field to be measured, which avoids any forbidden measuring axis.

Although satisfactory in certain respects, such a probe still suffers from disadvantages:

a) The contact rings 44, 46 are placed in the resonator and therefore significantly intercept the hf field established therein and transmit it to the measuring circuits which are consequently disturbed.

b) Each contact ring has a volume well below that of the main hemispherical coil, the number of turns and the diameter of the wire being smaller. For example, the hemispherical coil can have 2000 0.45 mm diameter wire turns, whereas each contact ring only has 500 0.2 mm turns. Thus, there is an electrical asymmetry and a relatively high resistance of the windings due to the contact rings. Therefore the latter cause significant noise and participate only slightly in detecting the signal.

c) The connection by strips or foils 39' between the two bottles for the purpose of closing the resonator is relatively fragile. Moreover, these strips form part of the resonator, which is consequently not frequency-stable, e.g. during temperature variations and is also not reproducible between individual probes.

d) Each probe block is asymmetrical, not very compact, fragile and non-tight. The relative spacing of the two blocks will make the probe even more fragile.

The present invention aims at obviating all these disadvantages. To this end, it proposes a very compact, symmetrical structure, in which each bottle is located in its own resonator, the assembly being completely surrounded by the lf coils, which are positioned in a symmetrically facing and interconnected manner.

The arrangement according to the invention offers numerous advantages from several standpoints:

a) Mechanical characteristics: The enveloping shape of the coils makes it possible to protect the bottle and rigidify the assembly. In addition, the connection by foils between the two bottles, which was very fragile, has been eliminated.

b) Sealing: The enveloping coils make the probe tight, except at its ends, but the complete sealing is easily brought about by probe end plates.

c) Shield: The coils form a shield with respect to the external radiation and with respect to the internal radiation due to the resonators.

d) Thermal stability: The compactness of the probe and the thermal conductivity of the coils permits a better temperature homogenization and a reduction in the thermal drift when the probe is exposed to a thermal transient.

e) Reduction of the noise: The connection of the coils in series-opposition, their joining and their alignment eliminate the effect of external interference fields and the noise level of the probe is further reduced by reducing the resistance of the coils.

f) Maintaining the electrical balance: The reduction of the overall inductance of the lf circuit displaces the interfering tuning frequency from said circuit towards the high frequencies and leads to a better maintenance, in the 1 to 3 kHz band, of the symmetry of the electrical characteristics of the two coil assemblies and consequently of the balance produced by the resistive bridge.

g) Thermal stability of the resonator: The dimensions of the resonator are stable, because they are only dependent on the bottle and not, as in the prior art, on connecting foils.

h) Minimization of the hf radiation: In the structure according to the invention, there is no longer a lf winding in the resonator. Thus, there is no longer a lf connection in the vicinity of the resonator, which greatly reduces the hf radiation of the probe.

i) Amplitude isotropy: The amplitude of the detected signal is not very sensitive to the angle between the axis of the probe and the direction of the measured field. This advantage is vital for applications where the sensor is not fixed. It is also possible to act on the isotropic character of the probe by changing the relative numbers of turns in each pair of coils.

j) Frequency isotropy: The minimization of the hf radiation makes it possible to reduce the frequency anisotropy of the probe, because this radiation was the main cause thereof. The symmetry of the two blocks and in particular the resonators also makes it possible to reduce the frequency anisotropy, because the interfering d.c. current flows (due to thermocouple or rectifier effects in the resonator) are symmetrical and cancel one another out in detection. The symmetries are geometrical, electrical and thermal and, if the two radical solutions are identical also physical. The compact shape of the bottles and the coils (particularly spherical) reduces anisotropy. The shape effects due to the paramagnetic or diamagnetic elements are eliminated.

k) Proximity of the two probes: With the prior art version, it was not possible to place two probes closer together than 2 meters without a pulsation or beat phenomenon occurring in their oscillation frequency, which was due to the hf and lf radiation. In particular, the lf field created by a probe is differently intercepted by the two main coils of the other probe. The beat frequency is proportional to the gradient of said field between the two bottles. In a compact probe like that of the invention, the hf radiation is reduced and the alignment of the axes of the coils is adequately controlled so as to ensure that on placing the probes in parallel and at the same level, the lf gradient created by a probe is zero between the two coil assemblies of the other probe and that there is no longer any pulsation or beat.

l) Each coil associated with the block fulfils both a sampling function and an exciting function and consequently ensures both a geometrical and an electrical symmetry of the probe.

More specifically, the present invention relates to a nuclear magnetic resonance probe incorporating at least two bottles with radical solutions, one having a positive nuclear polarization and the other a negative nuclear polarization, at least one high frequency, coaxial resonator and, around each bottle, an assembly of low frequency, exciting-sampling coils, said coil assemblies being interconnected and connected to an amplifier in a loop oscillator connection, said probe being characterized in that it comprises two blocks having a symmetry of revolution with respect to one axis and a symmetry with respect to a plane perpendicular to the axis of revolution, each block incorporating at least one bottle having a shape of revolution about the axis and symmetrical with respect to said plane of symmetry, a coaxial resonator having the same symmetries as the bottle and containing the bottle and a double low frequency coil of revolution about the axis and completely surrounding the resonator and the bottle and formed from two coils of revolution facing one another on either side of the plane of symmetry of the block, said two coils being interconnected.

It is pointed out that a shape of revolution is produced by a curve rotating about an axis. If the curve is a circle and the axis a diameter of said circle, a spherical shape is obtained. If the curve is a square and the axis a diagonal of said square, a double cone or biconical shape is obtained, if the axis is a median axis of the square a cylindrical shape will be obtained, etc.

According to an embodiment, the two blocks are placed end to end, their axes coinciding.

According to another embodiment, the two blocks are positioned side by side, their axes being parallel.

In all these embodiments, the two bottles can contain the same radical solution, the two resonators associated with these two bottles then having to resonate on two different frequencies respectively corresponding to a positive polarization for one of the solutions and to a negative polarization for the other.

However, in a variant, the two bottles can contain different radical solutions, the two resonators associated with these two bottles resonating on the same frequency corresponding to a positive polarization for one of the solutions and a negative polarization for the other.

With regards to the materials which can be used for forming the radical solutions, they are well known in the art. Information thereon is given by the aforementioned documents, as well as EP-A-0 185 825, FR-A-2 063 416 and U.S. Pat. No. 3 966 409. In exemplified manner only, reference is made to deuterated TA-NO$^{15}$N dissolved in a mixture of DME (dimethoxyethane) and water, as well as TANO$^{15}$N dissolved in methanol.

The first solution can be used in both bottles, provided that one of the resonators is tuned to 57.6 MHz and the other to 58.9 MHz.

The second solution can be suitable for both bottles, provided that one of the resonators is tuned to 58.9 MHz and the other to 60.5 MHz.

The first solution can be used in one of the bottles and the second in the other, the two resonators being tuned to 58.9 MHz. Preferably, the coils are connected in series-opposition.

The invention is described in greater detail hereinafter relative to non-limitative embodiments and the attached drawings, wherein show:

DETAILED DESCRIPTION OF THE INVENTION

Figure 3:
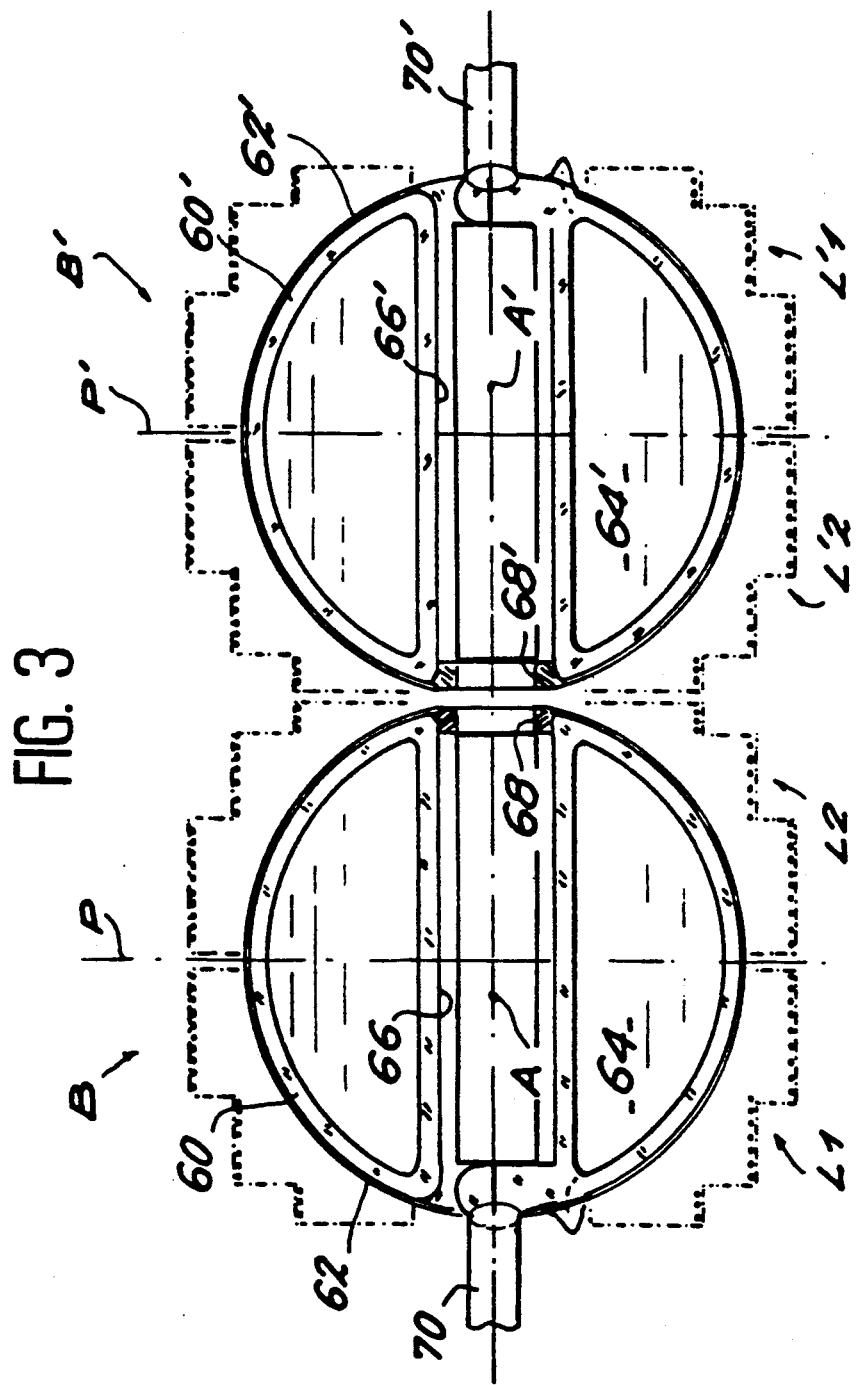
FIG. 3 A probe according to the invention with two spherical blocks connected end to end.

FIG. 3 shows a probe having two symmetrical blocks B and B'. The means constituting these two blocks carry the same numerical references, that of block B' being followed by an apostrophe.

The block B (B') comprises a spherical bottle 60 (60'), e.g. of glass or pyrex, whose outer surface is coated with a metal coating 62 (62'), e.g. of silver and which is subdivided into sectors. This bottle contains a liquid sample 64 (64').

The bottle has a central channel traversed by an electrical conductor which, together with the outer conductive layer 62 (62') forms a resonator. The latter is supplied with high frequency energy by a coaxial cable 70 (70') connected to a not shown, high frequency generator. Tuning capacitors 68 (68') are provided between the end of the central conductors and the external metal layer.

Figure 1:
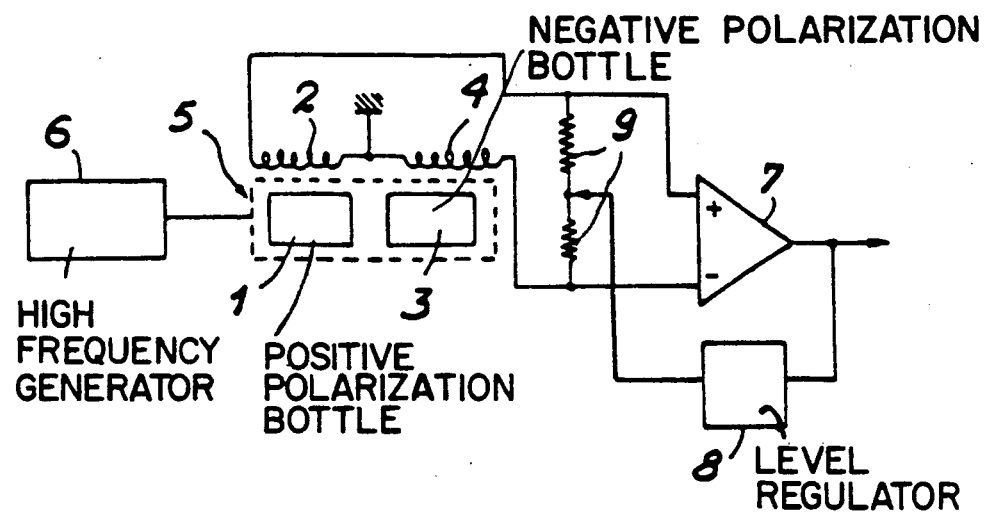
FIG. 1, already described, an oscillator connection of a prior art NMR probe.
Figure 2:
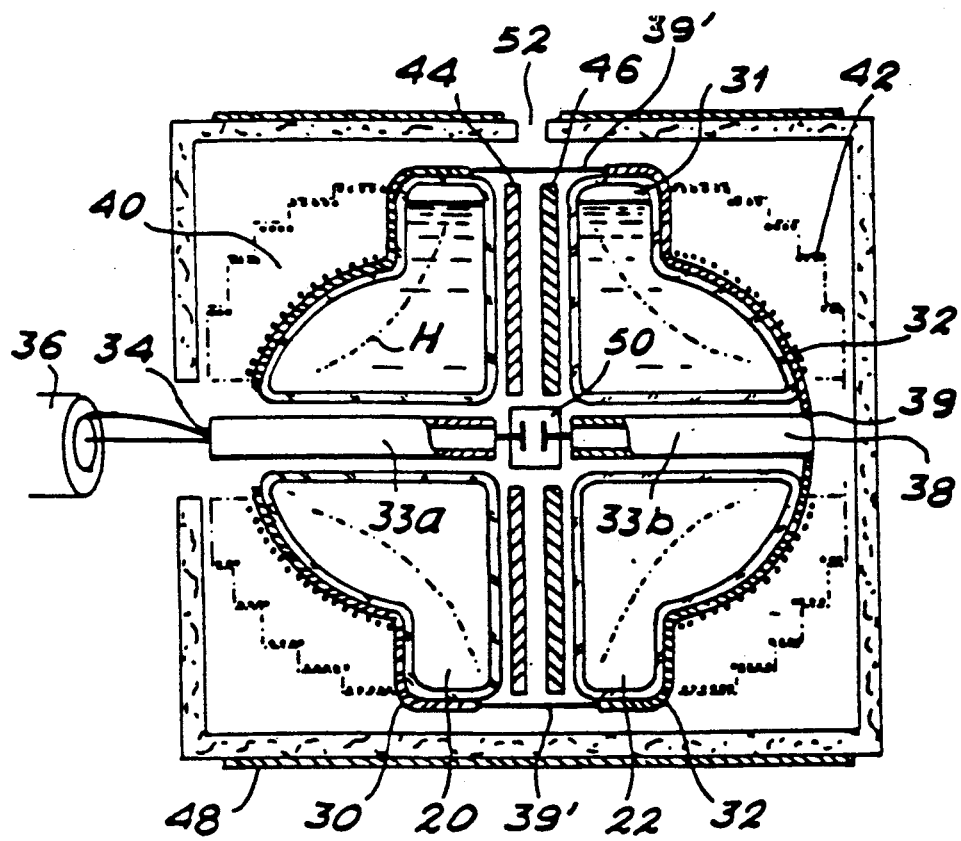
FIG. 2, already described, in section the structure of a prior art probe.

Therefore each bottle is of revolution about an axis A and is also symmetrical with respect to a plane P (P') perpendicular to said axis. By construction, each bottle is located within a resonator belonging to it (whereas in the prior art and as illustrated in FIG. 2, the two bottles share the same resonator). This resonator has the same symmetries (of revolution relative to the axis A and to a plane) as the bottle.

The assembly of low frequency windings is constituted by a double coil L1, L2 (L'1, L'2) completely surrounding the bottle and the resonator. The two coils of each assembly are positioned in facing manner and symmetrically with respect to the plane of symmetry P (P') of the block. Electrically speaking, these coils are not necessarily identical, as will be made apparent hereinafter and one can have less turns than the other and it is possible to use a smaller diameter wire in one case than in the other.

These windings are connected in series-opposition, i.e. the current flowing through them flows in the opposite direction in the two coils (as opposed to a series-series connection where the currents flow in the same direction).

Figure 4:
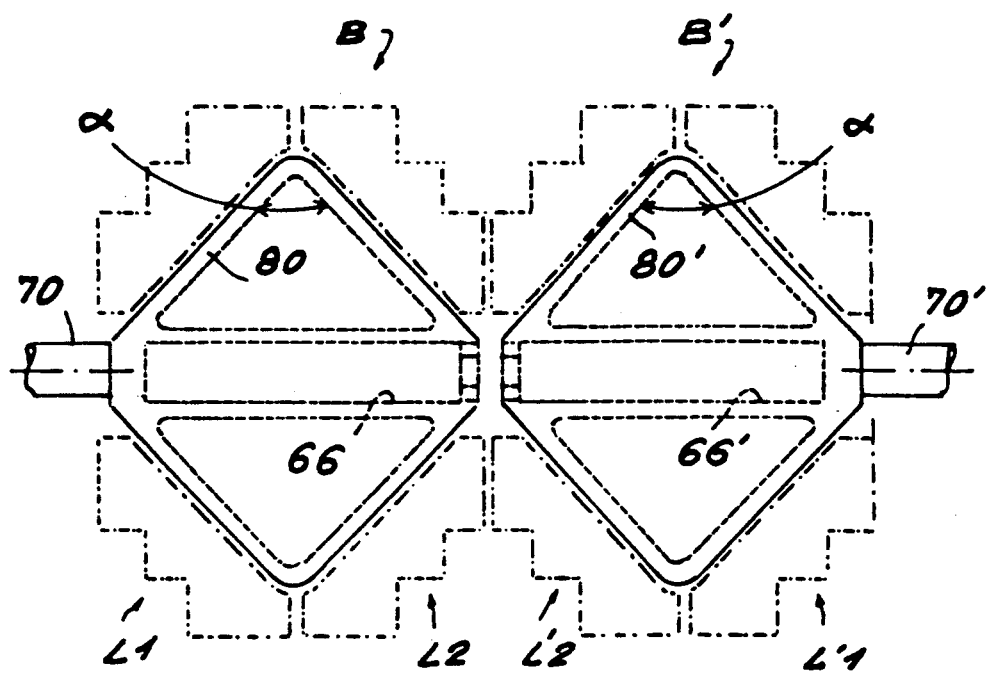
FIG. 4 A probe according to the invention with two biconical blocks connected end to end.

FIG. 4 shows another embodiment in which the bottle 80 (80') and the external conductor of the resonator have a triangular section toroidal shape. The interest of this shape is that it is possible to act on the isotropy of the probe by choosing an appropriate value for the angle α of the bottle (FIG. 4).

Figure 5:
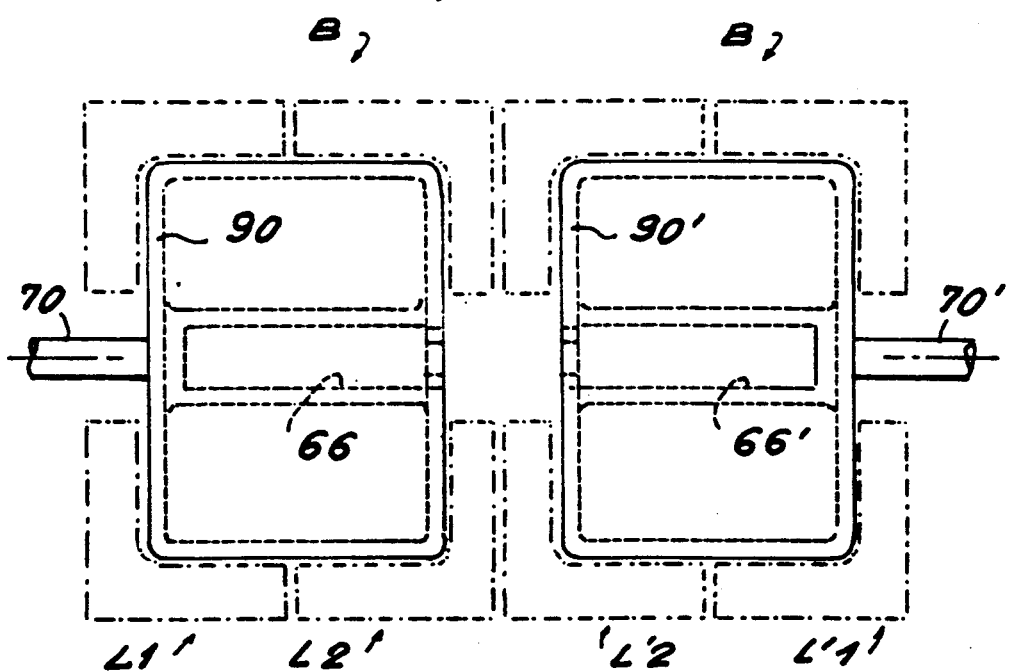
FIG. 5 A probe according to the invention with two cylindrical blocks connected end to end.

FIG. 5 shows another embodiment in which the bottles and the external conductor of the resonator have a cylindrical shape.

Figure 6:
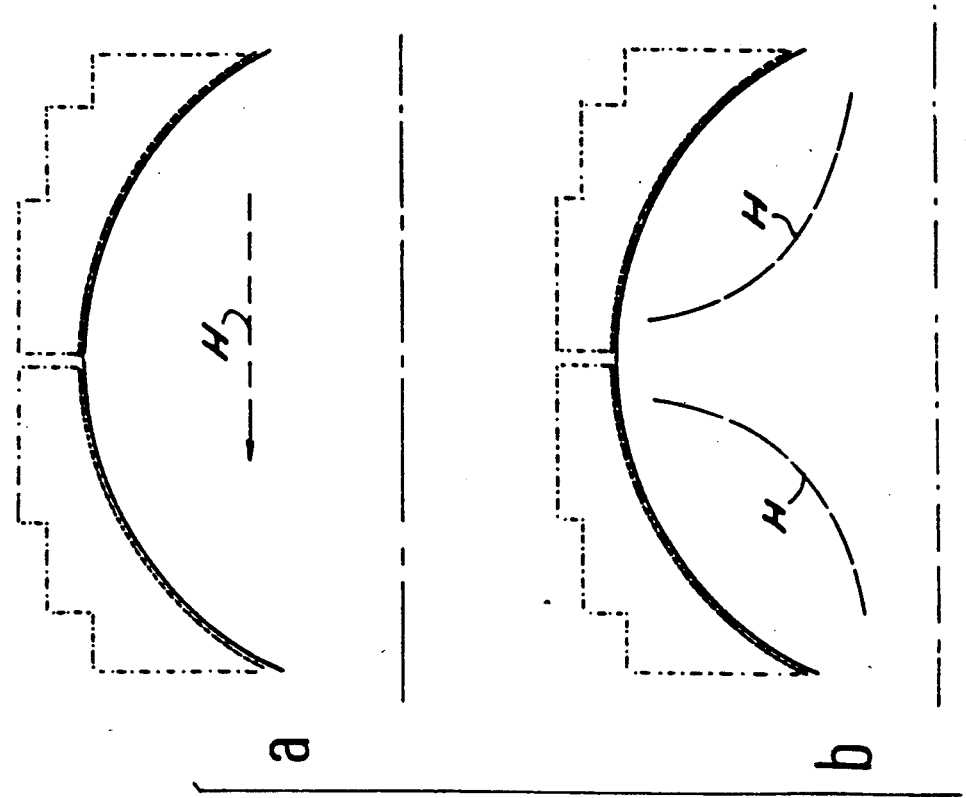
FIG. 6 A probe according to the invention with two spherical blocks connected side by side.

FIG. 6 shows a variant in which the two blocks B and B', instead of being placed end to end as in FIGS. 3 to 5, are placed side by side, their axes A and A' being parallel.

Figure 7:
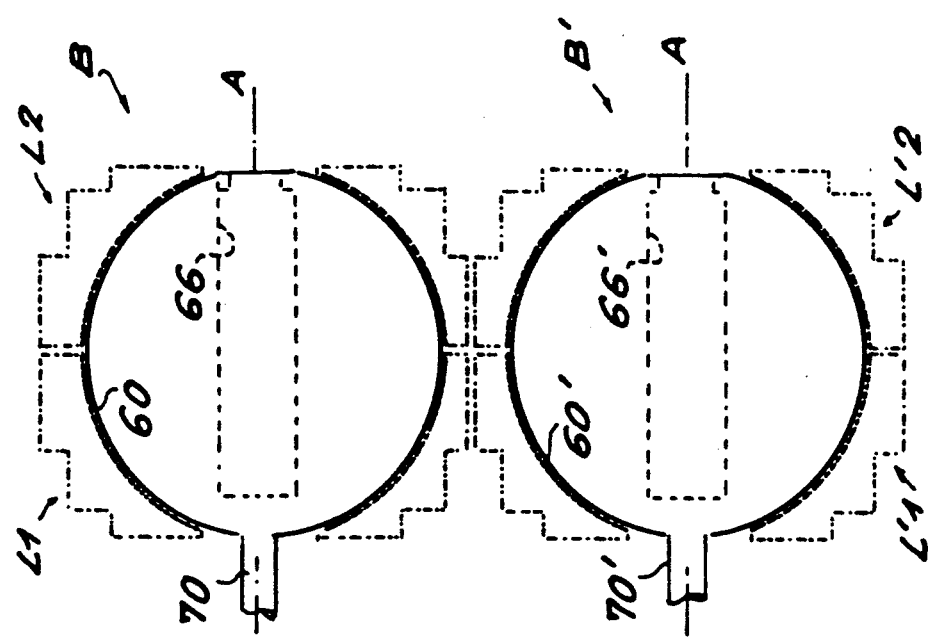
FIG. 7 The detection field lines within two coils connected in series (a) or in opposition (b).

FIG. 7 stresses the interest of the series-opposition connection of the two coils relative to the same bottle. In part (a) of FIG. 7 it is assumed that the two coils were connected series-series. The assembly then behaves in the same way as a single coil and the detection field lines H are parallel to the axis. If the field to be measured is also parallel to said axis, no area of the sample will be exposed to a sampling field not parallel to the field to be measured (which is the necessary condition for the operation of a NMR probe). Thus, there is a forbidden measuring axis for the probe, namely the same axis as the latter. However, the series-series connection can be advantageous in the case where the probe is fixed and orientable with respect to the field, so as to place the probe in an axis perpendicular to the forbidden axis. This special connection makes it possible to obtain a higher output signal amplitude.

With a series-opposition connection, in the manner illustrated in part (b) of FIG. 7, the sampling field lines H are curved inwards. No matter what the direction of the field to be measured, there is always an area of the sample which will be exposed to a field not parallel to the field to be measured, so that there is no longer a forbidden axis.

Moreover, by acting on the structure of the two coils L1, L2, it is possible to further reduce the slight existing amplitude anisotropy, as will be shown by the two following examples.

EXAMPLE 1

All the coils L1, L2, L′1, L′2 have the same number of turns (1325) and the same wire diameter (0.4755 mm). Two cases are to be compared: a) for coils connected series-series for a magnetic field parallel to the axis, the measuring signal would be zero, whereas for a field perpendicular to the axis, the signal would be 6.18 (in effective microvolts), so that the amplitude anisotropy would be infinite, in accordance with the explanations given in connection with FIG. 7a; b) for coils connected in series-opposition (cf. FIG. 7b), the signal obtained with a field parallel to the axis is 4.26 and 3.66 with a field perpendicular to the axis, so that the amplitude anisotropy is therefore (4.26−3.66)/4.26, i.e. 14%.

EXAMPLE 2

The opposite coils L1, L′1 have 1900 0.40 mm diameter wire turns and the joined coils L2, L′2 have 1325 0.475 mm turns. In the series-opposition connection with a field parallel to the axis, the measurement signal is 4.34, whereas with a field perpendicular to the axis the signal is 4.49, so that the amplitude anisotropy has dropped to 3%.

Thus, the probe according to the invention has a surprising property, whereby a virtually perfect amplitude isotropy is obtained despite a structure highly favouring one axis (the axis of revolution). This property is obtained as a result of the series-opposition connection and the careful choice of the number of turns of the coil pairs.

Figure 8:
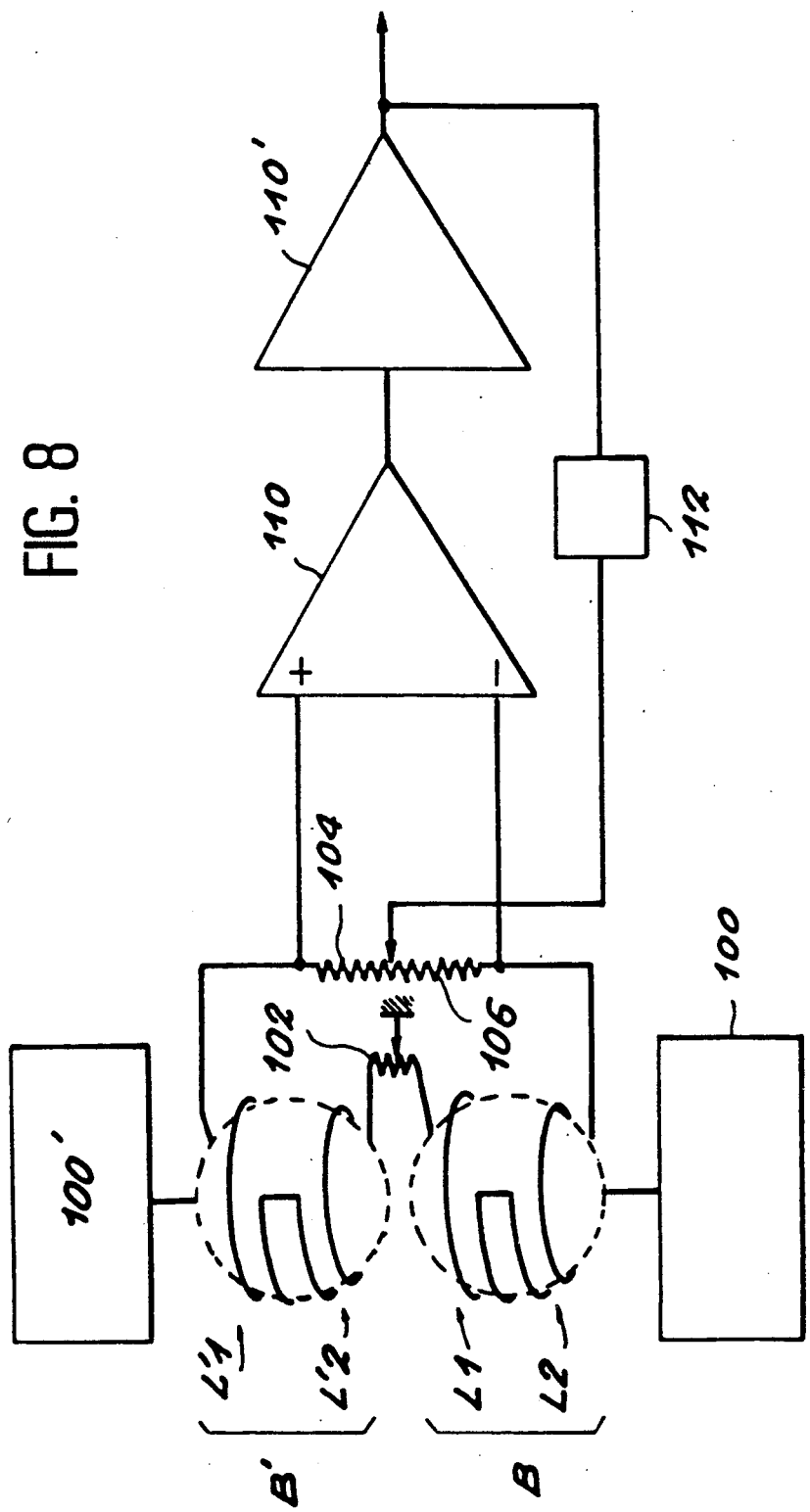
FIG. 8 A diagram of the oscillator connection of a probe according to the invention.

FIG. 8 shows the oscillator connection diagram of a probe according to the invention. The coils L1, L2 of the block B and the coils L′1, L′2 of the block B′ are connected in series-opposition in each block, in the manner explained hereinbefore. Moreover, the two double coils (L1, L2), (L′1, L′2) are connected in series-opposition across a resistor 102 connected to ground at its center point. The free ends of the two double coils are connected across a resistor bridge 104, 106. This bridge is also connected to the inputs of a linear differential amplifier 110, optionally followed by another amplifier 110′. The amplified output is relooped onto the bridge 104, 106 at a regulatable point making it possible to obtain a balance. Two hf generators 100, 100′ supply the two independent resonators of the two blocks. The amplified output constitutes the output S of the probe. The frequency of the signal available at S is directly proportional to the intensity of the ambient magnetic field.

The invention described hereinbefore can be carried out with a random number of samples and with all atomic nuclei known in NMR (protons or others).

We claim:

1. A nuclear magnetic resonance probe comprising: first block having a first axis and a first symmetry plane perpendicular to said first axis, said first block having:
   a first bottle having an axis identical with said first axis and a symmetry plane identical with said first symmetry plane, said first bottle containing a first radical solution having a first nuclear polarization,
   a first high frequency coaxial resonator surrounding said first bottle,
   two first coils surrounding said first high frequency coaxial resonator, said two first coils facing one another on opposite sides of said first symmetry plane, said two first coils being electrically interconnected;
   a second block having a second axis and a second symmetry plane perpendicular to said second axis, said second block having:
   a second bottle having an axis identical with said second axis and a symmetry plane identical with said second symmetry plane, said second bottle containing a second radical solution having a second nuclear polarization opposite to said first nuclear polarization,
   a second high frequency coaxial resonator surrounding said second bottle,
   two second coils surrounding said second high frequency coaxial resonator, said two second coils facing one another on opposite sides of said second symmetry plane, said two second coils being electrically interconnected, said two second coils being further electrically connected with said two first coils; and
   an amplifier having a first input connected to said first coils and a second input connected to said second coils, and having an output connected to said two first and two second coils.

2. Probe according to claim 1 wherein said first and second blocks, bottles, resonators and coils are spherical.

3. Probe according to claim 1 wherein said first and second blocks, bottles, resonators and coils are biconical.

4. Probe according to claim 1 wherein said first and second blocks, bottles, resonators and coils are cylindrical.

5. Probe according to claim 1 wherein said first and second blocks are placed end to end with said first axis of said first block and said second axis of said second block coinciding.

6. Probe according to claim 1 wherein said first and second blocks are placed side by side with said first axis of said first block and said second axis of said second block being parallel.

7. Probe according to claim 1 wherein said first and second radical solutions are identical, said first and second resonators resonating at a first frequency and at a second frequency respectively corresponding to said first nuclear polarization of a first sign for said first solution and to said second nuclear polarization for said second solution.

8. Probe according to claim 1 wherein said first and second radical solutions are different, said first and second resonators have the same resonance frequency corresponding to a nuclear polarization of a first sign for the first solution and to a nuclear polarization of a second sign for the second.

9. Probe according to claim 1 wherein said two first coils and said two second coils are connected together in series-opposition.

10. Probe according to claim 1 wherein said two first coils and said two second coils are made of a number of turns of an electrical conductor, said first and second coils having different numbers of turns. t

* * * * *